United States Patent
Wang et al.

(10) Patent No.: US 7,956,345 B2
(45) Date of Patent: Jun. 7, 2011

(54) CNT DEVICES, LOW-TEMPERATURE FABRICATION OF CNT AND CNT PHOTO-RESISTS

(75) Inventors: Shanzhong Wang, Singapore (SG); Mui Hoon Nai, Singapore (SG); Zhonglin Miao, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 583 days.

(21) Appl. No.: 12/008,992

(22) Filed: Jan. 14, 2008

(65) Prior Publication Data

US 2008/0203380 A1 Aug. 28, 2008

Related U.S. Application Data

(60) Provisional application No. 60/897,118, filed on Jan. 24, 2007.

(51) Int. Cl.
*H01L 29/06* (2006.01)
(52) U.S. Cl. ............ 257/9; 423/447.3; 423/445 B; 427/122; 204/192.14; 502/104
(58) Field of Classification Search .... 423/447.1–447.3, 423/455 B; 427/122; 257/9; 438/99; 204/194.14; 118/50; 502/104
See application file for complete search history.

(56) References Cited

U.S. PATENT DOCUMENTS

| | | | |
|---|---|---|---|
| 6,515,339 B2 * | 2/2003 | Shin et al. | 257/368 |
| 6,833,558 B2 * | 12/2004 | Lee et al. | 257/49 |
| 2006/0264323 A1 * | 11/2006 | Dijon et al. | 502/325 |

OTHER PUBLICATIONS

A self-assembled synthesis of carbon nanotubes for interconnects Zexiang Chen et al 2006 Nanotechnology 17 1062.*
Geohegan, D.B.; "In situ growth rate measurements and length control during chemical vapor deposition of vertically aligned multiwall carbon nanotubes". Appl. Phys. Lett. 83, 1851 (2003); doi:10.1063/1.1605793 (3 pages).*
Bonard, J.; "Watching carbon nanotubes grow". Appl. Phys. Lett. 81, 2836 (2002); doi:10.1063/1.1511539 (3 pages).*

* cited by examiner

*Primary Examiner* — Stuart Hendrickson
*Assistant Examiner* — Richard M Rump
(74) *Attorney, Agent, or Firm* — Lisa K. Jorgenson; William A. Munck

(57) ABSTRACT

A method is provided for growth of carbon nanotube (CNT) synthesis at a low temperature. The method includes preparing a catalyst by placing the catalyst between two metal layers of high chemical potential on a substrate, depositing such placed catalyst on a surface of a wafer, and reactivating the catalyst in a high vacuum at a room temperature in a catalyst preparation chamber to prevent a deactivation of the catalyst. The method also includes growing carbon nanotubes on the substrate in the high vacuum in a CNT growth chamber after preparing the catalyst.

20 Claims, 9 Drawing Sheets

3109-a, 600°C

D211-a, 500°C

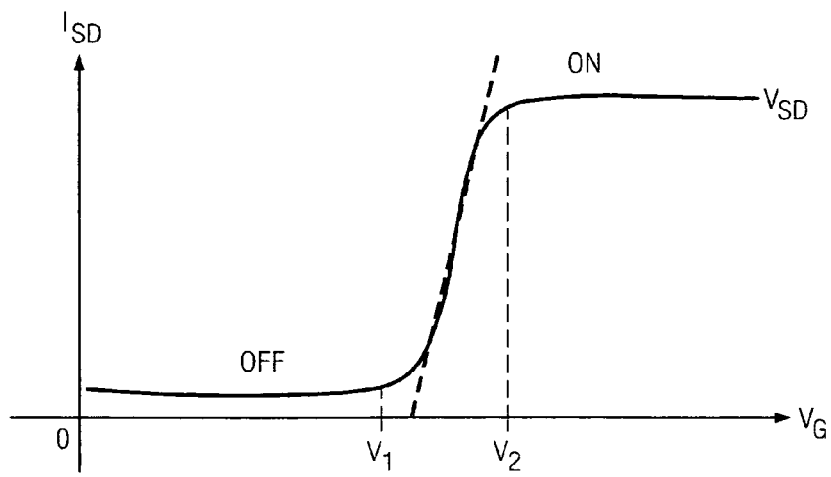
FIG. 2-3
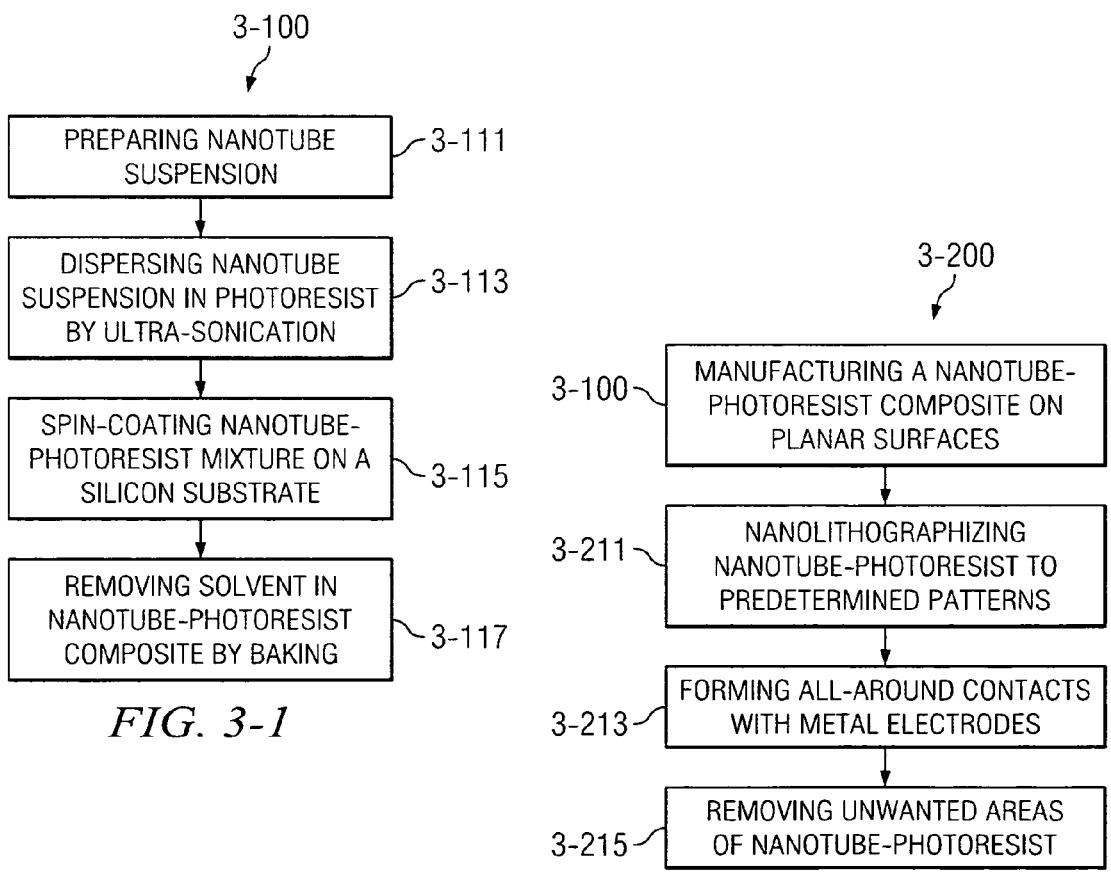
FIG. 3-1
FIG. 3-2

CNT DEVICES, LOW-TEMPERATURE FABRICATION OF CNT AND CNT PHOTO-RESISTS

CROSS-REFERENCE TO RELATED APPLICATION AND CLAIM OF PRIORITY

The present application is related to U.S. Provisional Patent No. 60/897,118, filed Jan. 24, 2007, entitled "CARBON NANOTUBES AND NANOTUBE PHOTO-RESISTS". U.S. Provisional Patent No. 60/897,118 is assigned to the assignee of the present application and is hereby incorporated by reference into the present disclosure as if fully set forth herein. The present application hereby claims priority under 35 U.S.C. §119(e) to U.S. Provisional Patent No. 60/897,118.

TECHNICAL FIELD

The disclosure relates generally to nanotubes, and in particular to structures, devices and photo-resists for carbon nanotubes.

BACKGROUND

The electronic industry has been striving towards the miniaturization and shrinking of transistor dimensions in commercial chips. In recent years, efforts have been made towards the research and development of nanoscale wires and devices. Nanotube, in particular, carbon nanotube (CNT) has been a promising material for incorporation into electronic circuits due to its superior transport property and nanoscale dimension. The hybrid technology combining CNT with the current silicon metal-oxide semiconductor (MOS) technology and new nanoscale materials is another promising CNT application.

A CNT can be categorized as a single-walled CNT (SWCNT) or a multi-walled CNT (MWCNT). Most single-walled CNT have a diameter of close to 1 nanometer, with a tube length that can be many thousands of times longer. The structure of a SWCNT can be conceptualized as a thin layer of graphite called graphene wrapping into a seamless cylinder. On the other hand, MWCNT consists of multiple layers of graphite rolled in on themselves to form a tube shape. The SWCNT exhibit some important electric properties that are not shared by the multi-walled carbon nanotube (MWNT) variants, they are the most likely candidate for miniaturizing electronics beyond the micro electromechanical scale.

CNTs can be chemically modified e.g., various molecules may be attached to the CNTs with an aim to give the CNT new functional properties and/or create biological and chemical sensors including, for example, DNA separation, protein recognition, and drug delivery capabilities).

Applications of CNTs include electron emitters for displays, electron beam sources and X-ray sources. CNTs may also be modified to better suit an application such as sensor application. For example, various molecules may be attached to CNTs to give the CNT new functional properties, or to create the biological and chemical sensors. The new function properties may include DNA separation, protein recognition and drug delivery capabilities. For these potential applications, CNTs need to be grown at a low temperatures on substrates with low melting points.

Another promising application of CNT is related to the substitution of metallic interconnects in the integrated circuits (ICs) distributing signals, power, ground supply lines and other elements for systems on a chip.

SUMMARY

In one embodiment, a method is provided for growth of carbon nanotube (CNT) synthesis at a low temperature. The method includes preparing a catalyst by placing the catalyst between two metal layers of high chemical potential on a substrate, depositing such placed catalyst on a surface of a wafer, and reactivating the catalyst in a high vacuum at a room temperature in a catalyst preparation chamber to prevent a deactivation of the catalyst. The method also includes growing carbon nanotubes on the substrate in the high vacuum in a CNT growth chamber after preparing the catalyst.

In another embodiment, a nanoelectronic device based on carbon nanotube (CNT) is provided. The nanoelectronic device includes a three-electrode structure having a gate electrode, a first electrode and a second electrode. The nanoelectronic device also includes at least one conductive nanowire that provides a current channel between the first electrode and the second electrode. The gate electrode, the first electrode, and the second electrode are arranged in parallel vertically, the gate electrode and the second electrode are placed with a fixed space in between, and the first electrode is placed between the gate electrode and the second electrode, and the first electrode is configured to be bendable in the fixed space.

In another embodiment, a method is provided for fabricating carbon nanotube CNT-photoresist composite. The method includes preparing a CNT suspension using a CNT structure-containing raw material, and dispersing the CNT suspension uniformly in a photoresist using ultra-sonication to produce a CNT suspension-photoresist mix. The method also includes spin-coating the uniformly dispersed CNT suspension-photoresist mix on a substrate to have a CNT-photoresist composite, and removing one or more solvents in the CNT-photoresist composite by baking.

In yet another embodiment, a method is provided for producing pure semiconductor carbon nanotubes (CNTs). The method includes placing a mix of semiconductive CNTs and metal CNTs in a controllable environment, and applying an adjustable laser to melt away the metal CNTs without affecting the semiconductive CNTs.

BRIEF DESCRIPTION OF THE DRAWINGS

For a more complete understanding of this disclosure and its features, reference is now made to the following description, taken in conjunction with the accompanying drawings, in which:

FIG. 1-2 shows a schematic view of a catalyst placed between two metal layers on top of a substrate according to one embodiment of the present disclosure:

FIG. 1-3 shows a schematic view of a thermal resistance layer placed to insulate a catalyst sandwiched between two metal layers from a substrate according to one embodiment of the present disclosure;

FIGS. 1-4A to 1-4E show CNTs grown at different temperatures (e.g., 600° C., 500° C., 400° C., 300° C. and 200° C.) according to one embodiment of the present disclosure;

FIGS. 1-5A and 1-5B show CNTs grown under identical conditions except where one was exposed to air, i.e., in FIG. 1-5A the catalyst was not exposed to air, while in FIG. 1-5B, the catalyst was exposed to air for 24 hours according to one embodiment of the present disclosure;

FIG. 2-1 illustrates a CNT field effect transistor (CNT-FET) according to one embodiment of the present disclosure;

FIG. 2-2 illustrates a CNT-based device structure according to one embodiment of the present disclosure;

FIG. 2-3 illustrates the on/off (switch) characteristics of a CNT device according to one embodiment of the present disclosure;

FIG. 3-1 illustrates a process for manufacturing a CNT-photoresist composite according to one embodiment of the present disclosure;

FIG. 3-2 illustrates a process for large-scale fabrication of nanotube devices according to one embodiment of the present disclosure;

FIG. 3-3A to 3-3C show various cross-sectional views illustrating the processing steps of manufacturing a CNT-photoresist composite according to one embodiment of the present disclosure;

FIG. 3-3D shows a top view of an array of fabricated nanotube devices according to one embodiment of the present disclosure;

FIG. 3-4 shows an exemplary scanning electron microscope photograph of multi-walled CNTs exposed and suspended from the edge of a patterned CNT photoresist composite according to one embodiment of the present disclosure;

FIG. 3-5 shows an exemplary scanning electron microscope photograph of multi-walled CNTs bridging across two titanium electrodes after a lift-off process according to one embodiment of the present disclosure.

DETAILED DESCRIPTION

Figure 1:
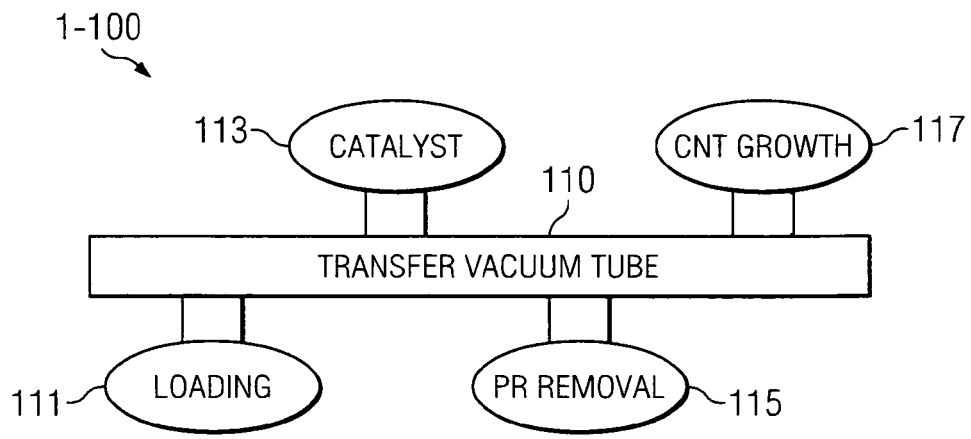
FIG. 1-1 shows a vacuum system and related processes for growing carbon nanotubes at a low temperature according to one embodiment of the present disclosure.

The present disclosure provides methods, systems and devices covering four areas of carbon nanotube related technologies. First, the present disclosure provides for a method and a system for growing CNT at a low temperature. Second, the present disclosure provides a CNT-based nanoelectronic device and a method of making the device applicable to non-volatile memory (NVM), logic circuits, and analog signal amplifiers. Third, the present disclosure provides a process for large-scale fabrication of a CNT-photoresist composite and a process for fabrication of CNT devices using the CNT-photoresist composite. Fourth, the present disclosure provides a process of fabricating pure semiconductive single-walled carbon nanotube (SWCNT) materials.

(A) Low-Temperature Growth of CNT

Since the discovery of the carbon nanotube (CNT), extensive research efforts have been devoted to the exploration of fundamental properties and potential applications of CNTs such as flat-panel field emission displays (FEDs), microelectronic devices, hydrogen and other gasses storage media, and anodes for lithium ion battery, among others.

Various techniques have been developed for making CNTs. These techniques include arc discharge, laser ablation, pyrolysis, thermal chemical vapor deposition (TCVD), hot filament plasma enhanced chemical vapor deposition (HFCVD), electron cyclotron resonance chemical vapor deposition (ECRCVD), plasma enhanced chemical vapor deposition (PECVD), rapid thermal processing, and electron beam induced formation. Different techniques may be used to produce CNTs of different characteristics. For example, the arc discharge and laser ablation methods have been widely used for the growth of single-walled carbon nanotubes (SWCNTs).

Low-temperature growth of CNT is a major challenge for mass-scale adaptation of CNT in various fields. The conventional techniques listed above have focused on the fundamental properties of CNTs rather than reducing the CNT growth temperature, to make applications of CNTs and CNT-based devices more practical. For engineering applications of CNTs in areas such as silicon-based micro- and nano-electronics, the growth temperatures between around 800° C. and 1000° C. are far above the desired value of approximately 450° C., making it difficult to integrate the CNT into silicon-based microelectronic chips without major modifications to the fabrication process. There is therefore a need for reducing the CNT growth temperature down to a value that is compatible with standard silicon-based processes.

For example, two commonly used CNT growth techniques are plasma enhanced chemical vapor deposition (PECVD) and thermal CVD. It has been widely accepted that CNT growth must be carried out at a high temperature approximately 800° C. for PECVD growth and 1000° C. for thermal CVD growth, which are obviously too high to be compatible with standard silicon-based semiconductor processes and glass-based FED production processes. The physical or chemical nature of the problem of high synthesis temperature is the amount of energy that is inevitably required for the start of the chemical reaction of CNT formation.

Moreover these two techniques require a very high deposition temperature of approximately 1000° C. and are followed up with complicated purification procedures, which could destroy most of pure carbon nanotubes. The high deposition temperature has become a major obstacle for applications of CNTs in microelectronics. For example, for the applications of field emission displays (FEDs), the direct deposition of CNTs at low temperature, particularly a CNT synthesis at temperatures as low as 550° C., is highly desirable in order to integrate CNTs with the sodalime glass substrates. For CNT applications in micro and nanoelectronics, a direct growth of CNTs at temperatures less than 500° C. over the large area of substrate is highly desirable. Moreover, the low-temperature growth of CNTs offers an opportunity to fabricate future ICs on much cheaper substrates such as glasses, ceramics, plastics, etc, making it feasible to use CNTs as electron channels for current transport, and greatly reducing the production cost without deterioration of the device performance.

Another illustration of a need for growing CNTs at a low-temperature is the potential for CNTs to be used as interconnects in nanoelectronics. According to the trends envisioned by the International Technology Roadmap for Semiconductors (ITRS), new materials and new processes are required for future interconnects that are capable of accommodating the high-speed transmission of signals in nano-sized elements. Copper interconnects provide the necessary characteristics with minimum feature sizes of 65 to 130 nm. However, the electrical resistivity of copper increases with decrease of the pitch due to the increase of scattering by surfaces and the grain-boundaries inside the wire in comparison with volume effects in more thick wires.

Moreover, copper interconnects are prone to electromigration effects under the high current density (i.e., greater than 106 A/cm$^2$). Based on these observations, CNTs are considered as one of the most promising candidates for interconnects. Recent studies showed that the current-carrying capacity of multi-walled CNTs did not deteriorate after 250 hours in the current density of 1010 A/cm$^2$ at 250° C. Nevertheless the incorporation of CNT interconnects in semiconductor technology depends on the success of CNT growth at low temperatures.

Therefore, there is a strong need for a technique to grow CNTs at a low temperature.

One embodiment of the present disclosure solves the problem of conventional in situ preparation of catalyst and low temperature growth of CNTs. Integration of in situ grown CNTs into silicon-based microelectronics as such elements of chips as interconnects, transistors, logic units, memory devices, high power microwave amplifiers, light emitters, optical detectors, semiconductor chip-based biosensors, actuators, electrical resistances, capacitors, inductances, nano tips for STM and AFM, nano tweezers and other nano tools, etc. are now possible. In addition, in situ grown CNTs for glass-based, plastic-based and ceramic-based substrates are also now possible.

FIG. 1-1 shows a high vacuum system and related processes 1-100 of catalyst deposition, catalyst patterning and CNT growth at low temperatures according to one embodiment of the present disclosure. The process 1-100 includes a step of loading a substrate into a catalyst loading chamber 111, a step of catalyst preparation at a catalyst preparation chamber 113, a step of photoresist removal 115, a step of CNT growth 117, and a step of transferring the catalyst in a transfer chamber 110.

The process 1-100 shown in FIG. 1 corresponds to the general process for growing the CNTs without deactivation in high vacuum ambient environments, making it possible to grow CNTs at low temperatures. The general process includes four general steps: (1) catalyst preparation; (2) catalyst reactivation; (3) catalyst nucleation; and (4) CNT growth. One point of this invention is that the entire CNT integration process is carried out in a high vacuum ambient environment (×10-7 torr or higher vacuum) or in inner gas ambience to prevent the deactivation of the catalyst.

According to one embodiment, the process of growing the CNTs at a low temperature may be described as follows. A wafer is placed into a loading chamber of the machine after a development process of photolithography, followed by a gas extraction process in a transfer chamber at temperatures from 100° C. to 200° C. for 3 minutes to remove the absorbed gases on the wafer surface or in the wafer, as well as the residual water or other organic and inorganic solvents. Then the wafer is cooled down to a room temperature and transferred to a catalyst preparation chamber, where an active catalyst is deposited onto the wafer surface by evaporating, sputtering, spin coating or spreading. The wafer is then transferred to the transfer chamber for an additional gas release process. The lift-off process is performed in the removal chamber, where the photoresist is dissolved by the spreading of photoresist removal liquids or hot vapor. The wafer with patterns of catalyst prepared is positioned in the transfer chamber for an additional process of degassing. Finally, the CNT are grown above the aforementioned wafer in the growth chamber.

The present disclosure is based oil the observation that there is a fast catalyst deactivation that can occur when the catalyst is exposed to air due to the oxidation process of the catalyst in the presence of $O_2$, $N_2$, $H_2O$, and $CO_2$ etc. Therefore, according to one embodiment of the present disclosure, prevention of active catalyst from being deactivated may be achieved by keeping the catalyst in a high vacuum environment or inner gas ambience during the process of CNT growth.

The standard process step of catalyst reactivation usually carried out at high temperatures could be skipped if the deactivation reaction is prevented. When the solution of catalytic nanoparticles is used to fabricate the protected catalyst, the step of catalyst nucleation could also be omitted according to one embodiment. This modification aids in avoiding the high temperature process of catalyst nucleation.

There is a step of catalyst reactivation before the catalyst preparation step. The step of catalyst reactivation may include two parts: (1) the chemical process of reduction of catalyst-containing compounds; and (2) the formation of catalyst particles. The first part of reducing the catalyst-containing compounds or precursors is a process of $MO_x$ where the precursor M can be iron (Fe), Cobalt (Co), or Nickel (Ni), and the process may be expressed as the following chemical equations 2.1 through 4 shown below. Each of reduction reactions will occur only when the precursors absorb enough energy from the environment. Moreover, the formation of catalyst nanoparticles consumes the external energy. Practically, this means that both operations should be performed at high temperatures.

(Eqn. 2.1)

(Eqn. 2.2)

(Eqn. 2.3)

(Eqn. 3)

(Eqn. 4)

The substrate loading step 111, according to one embodiment of the present disclosure, may include loading a selected substrate into a loading chamber, and placing the catalyst on the selected substrate in a catalyst deposition chamber. This substrate loading step may take place at room temperature without a high vacuum ambient environment in the loading chamber.

The step of preparing catalyst 113 may include placing the catalyst on substrate surface, in between two metal layers, activating the catalyst in a high vacuum ambient environment to prevent the catalyst from be deactivated, and placing the catalyst on a substrate in a catalyst preparation chamber.

According to one embodiment of the present disclosure, experimental results suggest that an exposure to air could be one of the most important factors leading to the deactivation of the catalyst. Chemical reactions leading to the oxidation of catalyst or nitridation of catalyst or other chemical reactions could be summarized as Equations 5 through 8 below.

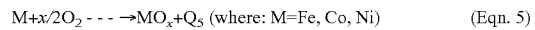

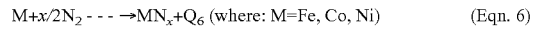

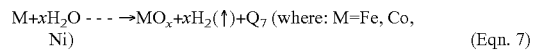

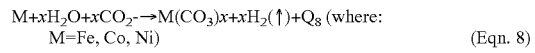

The step of photoresist removing and catalyst patterning 115 may be optional and can include a lift-off process that is performed in a vacuum environment or in inner gas ambience in order to prevent the catalyst from being deactivated via exposure to air. This step is needed when catalyst films are directly patterned with a photoresist material in order to produce CNT-based devices. A lithography technique is used to imprint patterns of a target CNT-device on the photoresist film. The lift-off process can remove solvent in the film and expose the imprinted structure of the CNT-device.

The step of growing the CNTs 117 in a growth chamber may include two steps: a catalyst nucleation and CNT growth. The first step of catalyst nucleation could be skipped if the catalyst nanoparticles have been activated earlier in the catalyst preparation process. In one embodiment, the catalyst nucleation was fulfilled by hydrogen plasma assisted annealing at temperatures from 200° C. to 300° C. for a period from 5 to 15 minutes. Then CNTs are grown by plasma enhanced chemical vapor deposition (PECVD) with methane ($CH_4$) diluted by hydrogen as a carbon source at a temperature from 200° C. to 300° C.

The produced CNT can be a crystalline form of carbon with entropy value lower than that of the carbon precursors methane ($CH_4$) and others in a gaseous state. Therefore, during the CNT growth process, energy is absorbed from an ambient environment. For example, CNT growth requires energy to be absorbed from an external source or sources of energy such as, for example, the high temperature sustained in a chamber or microwave plasma. The CNT growth process could be chemically described as a set of reactions shown in, for example, the relationship expressed in Equation 1 below.

(Eqn. 1)

$$CH_4(\uparrow) \xrightarrow{catalyst} C(CNT\downarrow) + 2H_2(\uparrow) - 96 \text{ kcal/mole}$$

At least 96 kcal of additional energy is generally required to transform a mole of $CH_4$ molecules into the CNT form, without taking into consideration the energy barriers of catalyst activation and other losses. The bond energies for C—H, C—C and H—H are 98 kcal/mole, 80 kcal/mole and 103 kcal/mole, respectively.

This low temperature CNT growth technique is applicable for directly growing CNTs on plastic and glass substrates if the softening temperature points of some plastic materials and some types of glasses are higher than 200° C. The substrate materials could be further extended to those whose softening temperature points are lower than 200° C. or to those materials biologically alive, when the following two techniques are used. The first technique is termed "chemical potential engineering", and the second technique is termed "substrate temperature controlling engineering". The two techniques are illustrated in FIGS. 1-2 and 1-3 and described therein.

Figures 1, 2:
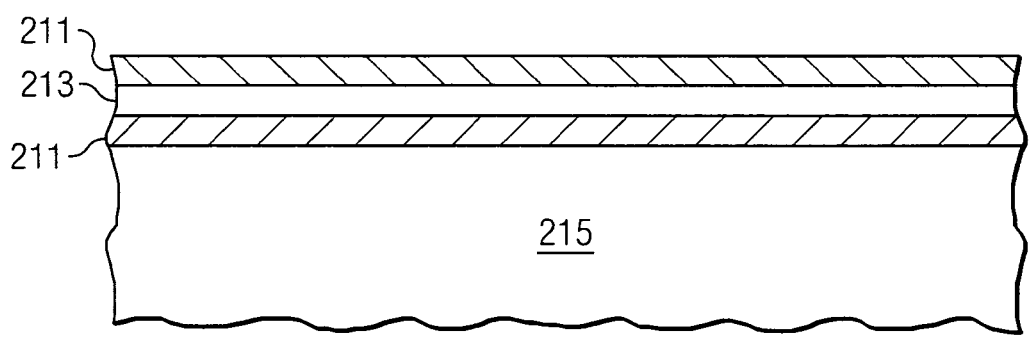
Figures 1, 2, 3:
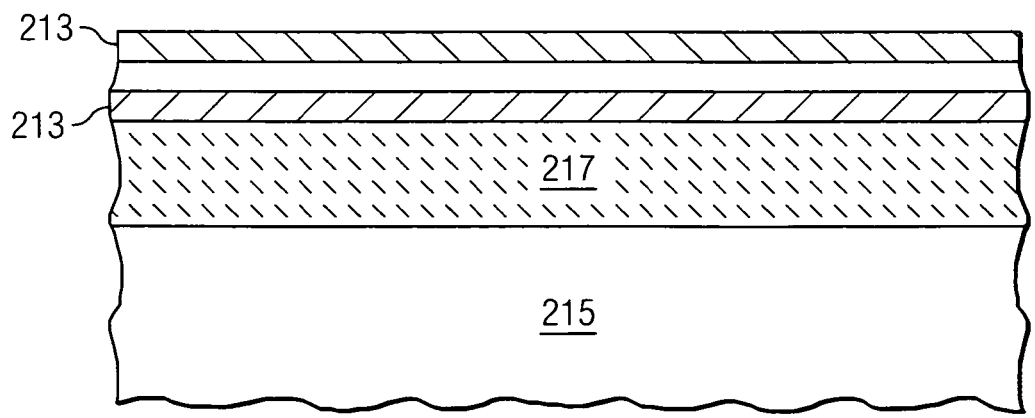

FIG. 1-2 illustrates how the "chemical potential engineering" technique works. The catalyst, which can be one of Fe, Co, Ni and others, is sandwiched in between two chemically active metal layers of higher chemical potentials. The metal layers may use Ti layers with the top Ti layer in less than 1 nm thickness, according to one embodiment of the present disclosure.

In one embodiment, the catalyst (Fe, Co, or Ni) layer used in the CNT growth experiment is in the thickness of around 0.5 nm, sandwiched in between two Ti layers. Physically and chemically, the catalyst was in the field of high chemical potential of Ti layers, making the catalyst more active and more effective in the CNT growth process and thus enables CNT growth at lower temperatures.

Putting catalysts in the field of high chemical potentials of other chemically active metals makes the catalyst more effective in the catalysis process of CNT synthesis, and thus lower the CNT growth temperature. Thermal resistance layer cannot reduce the CNT growth temperature, but can isolate the growth surface and point from the substrate by producing temperature difference between the growth surface and substrate. This approach can in principle enable the CNT growth on substrates at room temperature.

FIG. 1-3 illustrates how the "substrate temperature controlling engineering" technique works. The technique involves placing a thermal resistance layer between the substrate and the catalyst. The thermal resistance layer itself can not reduce the growth temperature of CNTs but isolate the CNT growth surface/point from the underlying substrates. The thermal resistance layer has a thermal resistance to heat transportation, enabling a large temperature gradient. Therefore a temperature difference between the growth surface and the substrate can be determined by the thickness of the thermal resistance layer. Therefore, the present disclosure provides a method that integrates CNTs into silicon-based technology allowing the growth temperature non-destructive for other components made by standard CMOS processing.

FIGS. 1-4A through 1-4E illustrate some CNT patterns grown at 200° C., 300° C., 400° C., 500° C. and 600° C., respectively. The nucleation of CNT at catalyst particles was observed at about 200° C., suggesting the possibility of CNT growth even at around 200° C. The entire CNT growth process occurred on pre-patterned substrates and can be split into the phases of catalyst preparation, catalyst activation and CNT growth.

The approach based on separation of the CNT growth process into different phases can help circumvent the problem of catalyst activation which could be achieved at higher temperatures. With additional protection layers covering the wiring beneath the layers, the CNT growth phase could be carried out at a lower temperature of approximately 200° C. after the removal of protecting layers. Thus, the catalyst activation at high temperature may be avoided if the deactivation of fresh catalyst prepared separately during the deposition on substrate can be prevented.

FIG. 1-5A and 1-5B show exemplary results of a comparative experiment in which sample (A) and sample (B) were grown under the same conditions, except that the catalyst in case (A) was never exposed to air while in case (B) the time of exposure to air was 24 hours, according to one embodiment of the present disclosure.

The growth results show that the catalyst without exposure to air has been alive and hence a CNT "forest" of high quality was produced, while no CNTs were found on the surface of sample (B), which was exposed to air.

(B) CNT Based Nanoelectronic Devices

FIG. 2-1 shows a conventional CNT field effect transistor (CNT-FET) device 2-100. The CNT-FET device 2-100 includes a single-walled carbon nanotube (SWCNT) based nanowire 2-101, source (S) electrode 2-103, a drain (D) electrode 2-105, an insulator 2-107, and a gate (G) electrode 2-109.

The conventional CNT-FET device 2-100 is similar to a semiconductor-based MOSFET device in its structure and working principle. The S electrode 2-103 functions as a source, the D electrode 2-105 as a drain, and the G electrode 2-109 as a gate. When a voltage is applied to the gate 2-109, the SWCNT nanowire 1-101 provides a current channel between the source 2-103 and the drain 2-105, which is modulated by the gate voltage. Depending on a negative or a positive voltage source that the drain 2-105 and the source 2-103 are connected to, a digital "ON" or "OFF" state between the drain 2-105 and the source 2-103 may result. The insulator 2-107 is based on silicon dioxide. The gate electrode 2-109 is a p-type semiconductor silicon.

There are several issues related to the conventional design of the CNT-FET device 2-100. One issue is the resistance of the CNT-FET device 2-100, which may have two components, i.e., the resistance (RCNT) of CNT nanowire 1-101, and the resistance at the contact point between the CNT nanowire 1-101 and the connected source electrode 2-103 and between the CNT nanowire 1-101 and the drain electrode 2-105. The resistance of the CNT nanowire could become the key point of future electronic devices, and therefore a subject of active research.

A second issue of the conventional CNT-FET is related to a lack of signal gain from CNT-FET structure such as the CNT-FET device 2-100. The lack of signal gain may be related to the weak field effect related to the device structure. As nanowire channel 2-101 scales down to about 1 nm, i.e., the diameter of SWCNT, the corresponding silicon oxide insulator 2-107 or the oxide layer could not be reduced down to about 1 nm or less accordingly in thickness to prevent the current leakage between the gate electrode 2-109 and the drain electrode 2-105. The oxide layer adopted in the CNT-FET device 2-100 is in the thickness between 10 nm to 100 nm for a sub-micron MOSFET device, which is one or two orders higher than the SWCNT nanowire channel width (about 1 nm). The mismatch between the oxide thickness and the SWCNT nanowire channel width can degrade the performance of the CNT-FET device 2-100. A much thinner oxide layer but with much high permittivity is needed to enhance the field effect of the gate electrode 2-109 for a better performance while keeping the current leakage between the gate electrode 2-109 and the drain electrode 2-105 at an acceptable level.

Another issue for the conventional CNT-FET device 2-100 is related to the separation of semiconducting SWCNT from metallic SWCNT. So far there is not a reliable method to control conducting type, either semiconducting or metallic type. Existing CNT devices are either metallic or a mixture of semiconducting CNT and metallic CNT. There is a need for such a reliable means to separate the two conducting types.

FIG. 2-2 shows a CNT device 2-200 that addresses the issues related to the conventional CNT devices as described above, according to one embodiment of the present disclosure. The CNT device 2-200 includes a top electrode 2-201, a middle electrode 2-203, a drain electrode 2-205, a substrate 2-217, and three insulators 2-211, 2-213 and 2-215. The CNT device 2-200 also includes a CNT nanowire channel 2-221 and a metal nanoparticle channel 2-223.

The three electrodes 2-201, 2-203, and 2-205 are isolated from each other and are arranged in parallel vertically with a fixed space between the top electrode 2-201 and the bottom electrode 2-205. The middle electrode 2-203 is bendable in the fixed space. The substrate 2-217 may be any material that can be hard or soft, organic or inorganic, and metallic or plastic. The CNT nano-wire channel 2-221 and the metal nanoparticle channel 2-223 provide a current channel between the middle electrode 2-203 and the bottom electrode 2-205 according to one embodiment of the present disclosure. In an alternative embodiment, in place of a combination of the CNT nano-wire channel 2-221 and metal nanoparticle channel 2-223, an entire CNT nano-wire based channel or an entire metal nanoparticle based channel may be used. By tuning the diameter and length of the nano-wire channel 2-221, the speed of the CNT based device 2-200 may be tuned as well. The middle electrode 2-205 may have a self-energy as small as its surface energy.

In contrast to the horizontally arranged 3-electrode structure in the conventional CNT device 2-100, the three electrodes 2-201, 2-203 and 2-205 of the CNT device 2-200 are placed in parallel vertically. This vertical aligned structure along with the insulators helps reduce the contact resistance between the CNTs and the non-CNT parts of the CNT-based device 2-200. Most horizontally-positioned nanotubes, such as the one shown in the nano-based device 2-100, have contact points either at the top or bottom surface connecting with metal electrodes. Poor coupling between the nanotube and the leads can result in large contact resistance, which can become dominant in electrical transport in nanotube devices. Hence, improving the interfacial coupling and minimizing the contact resistance can help fully utilize the ballistic transport characteristic of the material and integrate nanotube architectures into currently existing fabrication processes.

The working principle of the CNT device 2-200 is such that it would no longer reply on the inversion of substrate semiconductor materials induced by the top electrode 2-201, as in the case of conventional CNT-based device such as the CNT device 2-100. In one embodiment of the present disclosure, the CNT device 2-200 works as follows. Assuming that the middle electrode 2-203 is connected to a positive source, the state between the middle electrode 2-203 and the bottom electrode 2-205 could be 'ON' when the top electrode 2-201 is connected to a positive source. Assuming that the middle electrode 2-203 is connected to a positive source, the state between the middle electrode 2-203 and the bottom electrode 2-205 could be 'OFF' when the top electrode 2-201 is connected to a negative source. In this case, the CNT device 2-200 could serve as a memory device, a logic device, or an amplifier device. In another embodiment, assuming that the middle electrode 2-203 is connected to a positive source, the state between the middle electrode 2-203 and the top electrode 2-201 could be 'ON' when the top electrode 2-201 is connected to a negative source or 'OFF' when the top electrode 2-201 is connected to a positive source. In this case, the CNT device 2-200 could be used only as a memory device.

In one embodiment of the present disclosure, the working principle of the CNT device 2-200 may be represented as follows. Assuming that the top electrode 2-201 functions as a gate (G), the bottom electrode 2-205 as a drain (D), and the middle electrode 2-203 as a source (S), then the current ($I_{SD}$) between source and drain could be expressed as the following:

$$I_{SD} = V_{SD}/(R_C + R_{CNT})$$

where $V_{SD}$ is a bias between the source and the drain, and $R_C$ is a contact resistance between the nanowire channel 2-221 and the middle electrode 2-203. $R_{CNT}$ is an addition to the resistance of CNT nano-wire 2-221 itself which is linearly proportional to the length of the CNT nano-wire channel 2-221 if the nanowire channel 2-221 is not an ideal quantum wire. A minimum value of $I_{SD}$ is theoretically a zero for an "OFF" state. Physically, $R_{CNT}$ could have a minimum value, and $I_{SD}$ could correspondingly have a maximum value for an "ON" state. In between 'OFF' and 'ON' states, $I_{SD}$ could be controlled by the gate voltage for amplifier applications.

The CNT-based device 2-200 also includes the insulator 2-211 between the top electrode 2-201 and the middle electrode 2-203, the insulator 2-213 between the middle electrode 2-203 and the bottom electrode 2-205, and the insulator 2-215 between the bottom electrode 2-205 and the substrate 2-217. According to one embodiment, the present disclosure provides a an air layer for the insulator layer that reduces the electrostatic force by the permittivity of the insulator by several times. Because of these insulators and the CNT nanowires 2-221 functioning as a conductor, the CNT device 2-200 is no longer constrained by semiconductor materials and substrates.

In one embodiment of the present disclosure, the substrate 2-217 is either a glass substrate or a plastic substrate for manufacture of the CNT-based device 2-200. This allows for cost effective fabrication of the CNT-based devices.

In one embodiment, the present disclosure uses the Van der Waals force for non-volatile memory (NVM) application. The Van der Waals force could be adjusted by surface treatment so that the device performance could be enhanced.

Accordingly, in one embodiment, the present disclosure uses conductive nanowires as the current channel. Because the nanowires are not limited to semiconductors, they can be semiconducting or metallic, thus overcoming the issue of synthesizing pure semiconducting CNTs or separation of semiconducting CNTs from metallic CNTs.

The process for fabricating the CNT device 2-200 may include a step of creating a three-electrode structure, wherein the three electrodes are placed in parallel vertically to each other, a step of inserting a conductive nanowire (semiconductors or metals) between the middle electrode and making electrical contact with the nanowire, and a step of inserting insulators between the vertically placed electrodes.

FIG. 2-3 illustrates the on/off (switch) characteristics of one embodiment of the present disclosure. The on/off ratio could reach five orders, a satisfactory on/off performance for the memory device application of the CNT device 2-200. The gate could control the source-drain current sufficiently due to the contact area (or contact length) between the CNT and the source and electrodes adjustable by applying gate variable voltage. Hence, the device could be used as an amplifier. Because of the Van der Waals force between CNT and the electrodes, the CNT could remain attached on the electrode surface even after the gate voltage is removed. This characteristic could be used for non-volatile memory device applications.

According to one embodiment of the present disclosure, numerous applications based on the CNT-device 2-200 are possible. The applications include CNT-based amplifiers, CNT-based logic circuits, CNT-based memory devices, CNT-based sensors, CNT-based actuators, CNT-based nano-tools, CNT-based electromagnetic signal receivers and CNT-based sonar detectors.

(C) Large-Scale Fabrication of CNT-Photoresist Composite and CNT Devices Based on the Composite Currently, nanotubes that are used for making nano devices are usually in the form of as-grown powders or mixed into dispersions. Common methods for making CNT devices using the nanotube materials include chemical vapor deposition (CVD), and spin-coating of nanotube dispersion onto patterned wafers. One major drawback of the CVD-based approach involves subjecting the entire chip to high temperature deposition (about 750° C.), while the spinning-coating approach will likely result in contamination of the entire substrate surface. There is therefore a need for a reliable and repeatable manufacturing process that may minimize the substrate contamination at low or room temperature. The manufacturing process should also be compatible with the silicon metal-oxide-semiconductor (MOS) technology so that fabrication of nanoscale devices can be scaled up for mass production.

In one embodiment, the present disclosure provides a method for large-scale fabrication CNT-photoresist composite and a method of making nanotube devices using the CNT-photoresist composite. The first method is shown in FIG. 3-1 and the second method in FIG. 3-2.

FIG. 3-1 shows a process 3-100 for manufacturing a nanotube-photoresist composite on planar surfaces. The process 3-100 includes a step of preparing nanotube suspension 3-111, a step of dispersing nanotube suspension in photoresist by ultra-sonication 3-113, a step of spin-coating nanotube-photoresist mixture on a silicon substrate to produce CNT-photoresist film 3-115, and a step of removing solvent in nanotube-photoresist composite by baking 3-117.

The step of preparing nanotube suspension 3-111 can include selecting one raw nanostructure-containing material, preferably with a high-aspect ratio (nanotube) as the fillers of the composite material. The raw material can contain nanotubes made of carbon, silicon, copper, titanium, silver, gold, boron nitride, gallium nitride or other materials that contain nanostructure and possess semiconducting or metallic properties. Carbon nanostructured material can contain single-walled CNT (SWCNT) or multi-walled carbon nanotubes MWCNT). The SWCNT or MWCNT can be harvested using one of the suitable techniques including thermal chemical vapor deposition (CVD), plasma enhanced CVD (PECVD), laser ablation and arc-discharge.

The step of preparing nanotube suspension 3-111 can also include mixing the selected raw nanostructure-containing material with a suitable liquid medium. The liquid medium can be one of a surfactant, an alcohol and an organic solvent. In one embodiment, Dimethylformamide (DMF) is a choice of the liquid medium for its solubility in the photoresist material used for lithography. The concentration of nanotubes in suspension can vary depending on a desired density of nanotubes for the target CNT device, given that a stable suspension is obtained. For example, 0.5 mg of the raw material such as multi-walled CNT per ml of DMF solution forms a stable suspension. The suspension is subjected to ultrasonic energy or stirring at ambient temperature for an hour or until a uniform, stable suspension is obtained, according to one embodiment.

The step of dispersing nanotube suspension in photoresist by ultra-sonication 3-113 can include selecting a negative or positive photoresist. In one embodiment, Microposit 1800 series positive photoresist manufactured by Shipley is the choice of the photoresist. Then the step of dispersing nanotube suspension in the photoresist 3-113 can include dispersing or mixing the suspension containing uniformly dispersed nanotubes into the selected photoresist material.

The volume ratio of the nanotube suspension to the photoresist solution can vary depending on the desired density of nanotubes for the target CNT device. Another criterion for determining the volume ratio is the preservation of the viscosity and optical properties of the nanotube-photoresist composite for a lithographic processing. In one embodiment, a volume ratio of 2:9 carbon nanotube in the DMF suspension to Microposit photoresist solution is used.

The step of dispersing nanotube suspension in photoresist 3-113 then includes subjecting the nanotube-photoresist suspension to ultrasonic energy at an ambient temperature. In one embodiment, the duration of ultrasonication process is around 40 minutes or until the nanotube suspension is uniformly mixed with the photoresist solution. Then in one embodiment, the mixture is left to stabilize for at least 20 minutes to allow the removal of trapped air bubbles.

The step of spin-coating the nanotube-photoresist mixture on a silicon substrate 3-115 can involve selecting a substrate. A substrate can be made of silicon, glass, plastic, ceramic or any suitable material depending on desired functionality of the target CNT device. The step of spin-coating nanotube-photoresist mixture on the silicon substrate may also involve deciding a suitable spin speed to form a continuous and uniform film of the nanotube-photoresist on the substrate surface.

The step of spin-coating nanotube-photoresist mixture on the selected silicon substrate may also involve determining a desired thickness of the nanotube-photoresist film. The thickness of the film can depend on the desired density of nanotubes of the target CNT device. There is a tradeoff between a high density of nanotubes and easy removal of unwanted photoresist material. Typically, a thinner film enables easier removal of residue during a subsequent lift-off process. Variation in the viscosity of the nanotube-photoresist composite may affect the spin speed for a desired film thickness. In one embodiment, a spin speed of 5000 rpm is used for a 1 micrometer thick nanotube-photoresist film on an oxidized silicon wafer.

The step of removing solvent in the nanotube-photoresist composite 3-117 can involve a soft baking process to evaporate the liquid medium in the film at a temperature suitable for the selected photoresist material. In one embodiment, the film made of the Microposit photoresist is baked at 100° C. for one minute. This improves adhesion of the nanotube-photoresist film with the substrate surface before undergoing lithographic patterning.

FIG. 3-2 shows a process 3-200 for making CNT devices such as integrated circuits using the CNT-photoresist composite produced in the process 3-100. The method includes the step of manufacturing a nanotube-photoresist composite on planar surfaces 3-100, a step of lithographizing nanotube-photoresist to predetermined patterns, and exposing segments of nanotube 3-211, a step of forming all-around contacts with metal electrodes 3-213, and a step of removing unwanted areas of nanotube-photoresist using a lift-off process 3-215. Electrical contacts with the nanotube are improved using the all-around contact geometry derived from this invention. The step of manufacturing the nanotube-photoresist composite on planar surfaces 3-100 is the same process as illustrated in FIG. 3-1 and described therein above. The output of this step is a CNT-photoresist film of a desired thickness.

The step of lithographizing nanotube-photoresist to the predetermined patterns 3-211 can include imprinting the predetermined patterns of the target CNT device onto the CNT-photoresist film obtained from the process 3-100. This step may be accomplished using one of the techniques such as a photolithography and an electron-beam lithography commonly used in the semiconductor manufacturing industries.

The step of forming all-around contacts with metal electrodes 3-213 can involve selecting a suitable material to form contacts in the CNT-photoresist film. In one embodiment, one of a Tungsten (W), a Copper (Cu), a poly-silicon, a Palladium (Pd), an Aluminium (Al), and a Titanium (Ti) is selected to form the contacts in the CNT-photoresist film.

The step of removing unwanted areas of nanotube-photoresist 3-215 can include selecting a suitable remover to remove the unwanted parts and applying a lift-off process to leave the patterned electrodes formed all-around contacts with the CNTs.

Figures 3, 3A:
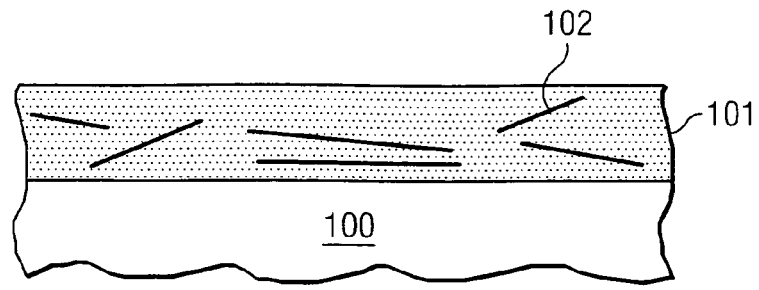
Figures 3, 3B:
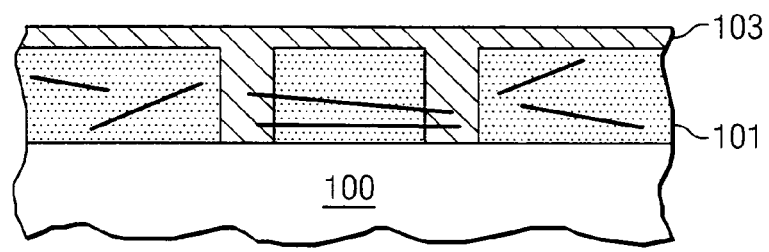
Figures 3, 3C:
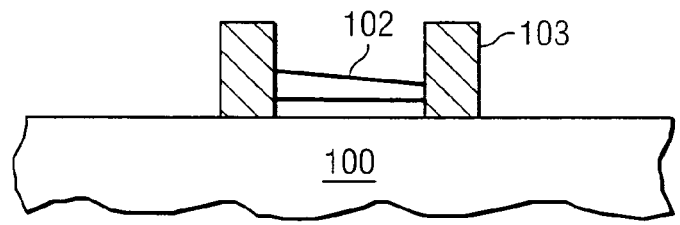
Figures 3, 3D:
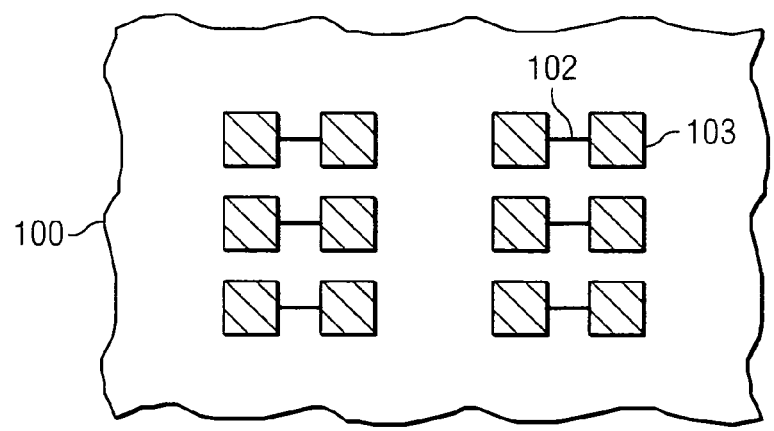
Figures 3, 4:
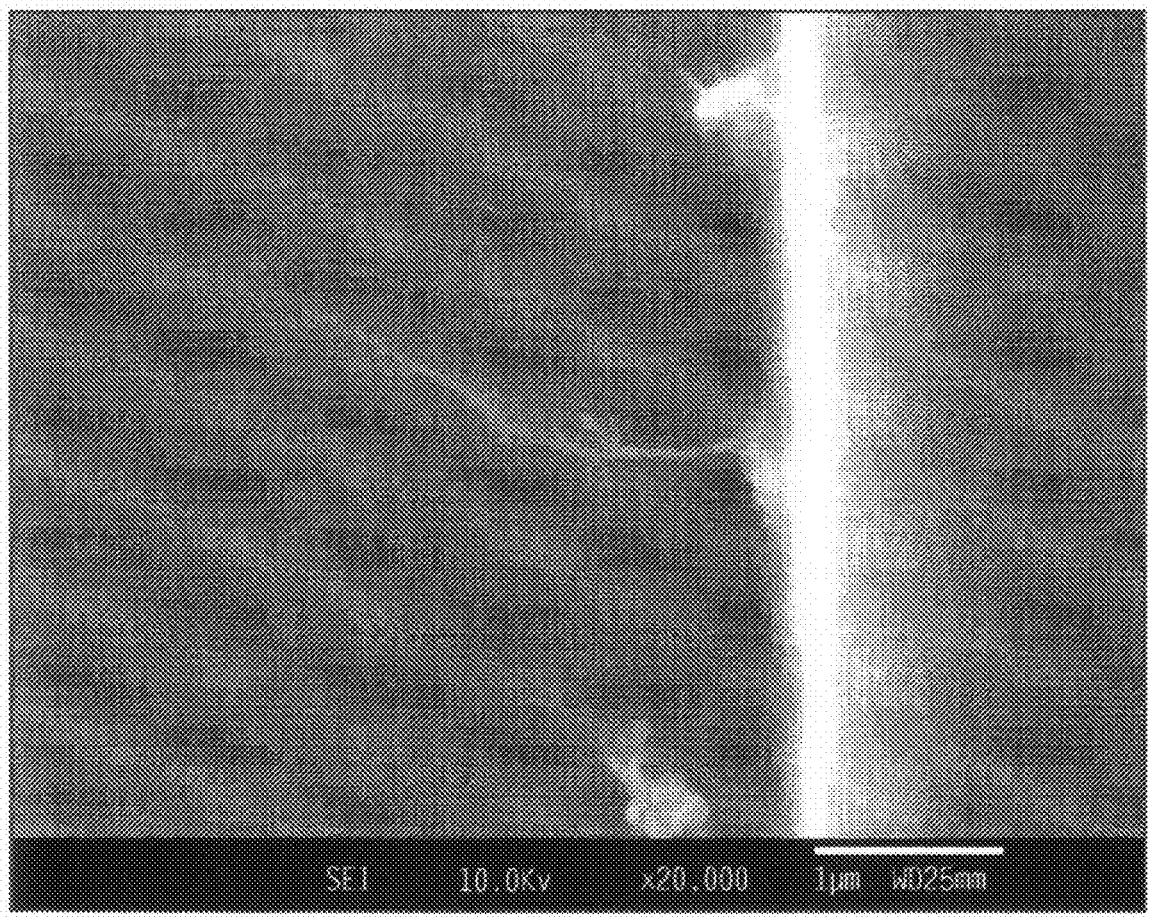
Figures 3, 4, 5:
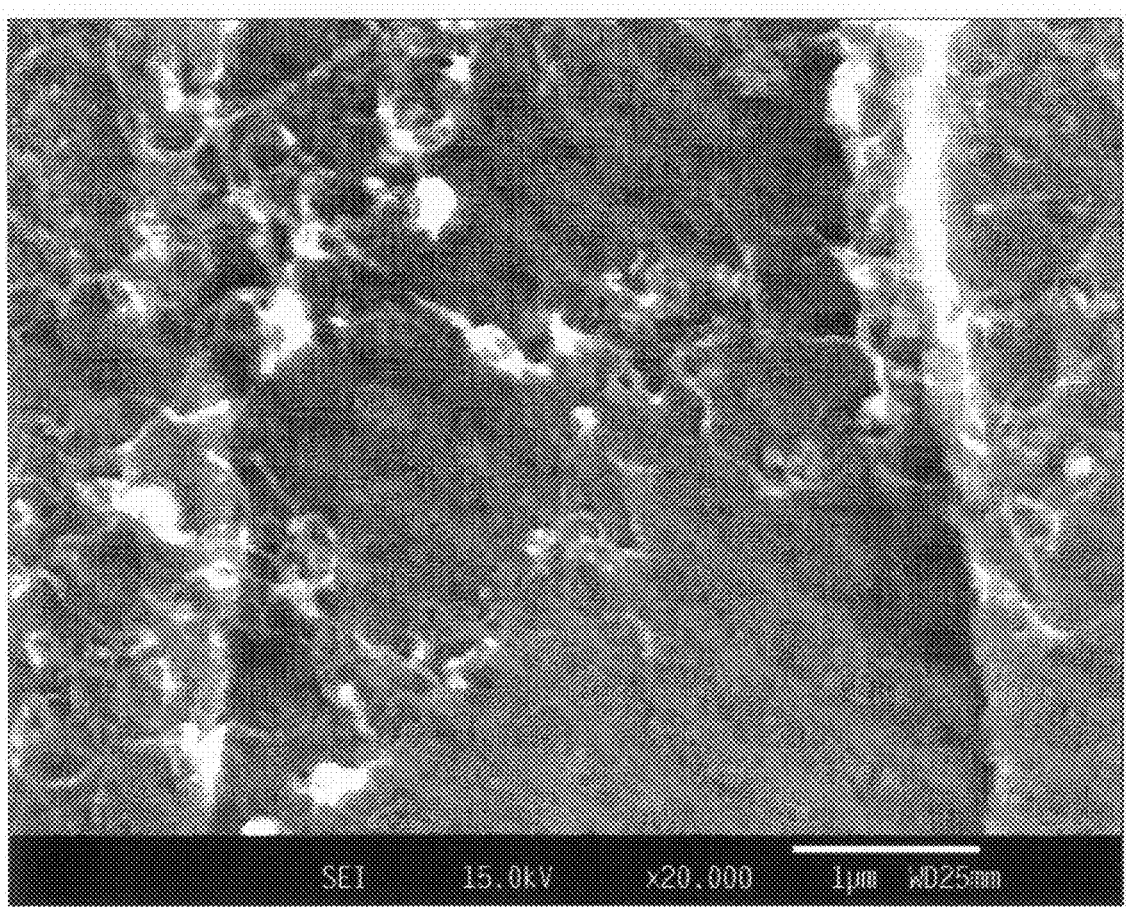

FIG. 3-3A through 3-3D show the examples of applying the steps of the process 3-200 for fabricating nanotube devices according to an embodiment of the present disclosure. As shown in FIG. 3-3A, a substrate 100 is coated with a positive photoresist film 101 that include nanotubes 102 that are prepared according to the steps illustrated in FIG. 3-1.

FIG. 3-3B shows that the film 101 is subjected to lithography to form the desired structures of the CNT device. The nanotube-photoresist film 101 is developed to form a mask layer and expose nanotubes at edges of the photoresist. Then, as shown in FIG. 3-3A, the nanotubes 102 are suspended and embedded in the photoresist matrix. This allows the formation of all-around contacts 103, fixing the nanotubes in place via sputtering or electron beam evaporation.

As shown in FIG. 3-3C, after a suitable remover and a lift-off process are applied, patterned electrodes 103 forming all-around contacts with the nanotubes 102 exposed. FIG. 3-3D shows an array of nanotube devices which can be fabricated using the method 3-200.

Figures 1, 2, 3, 4, 4A:
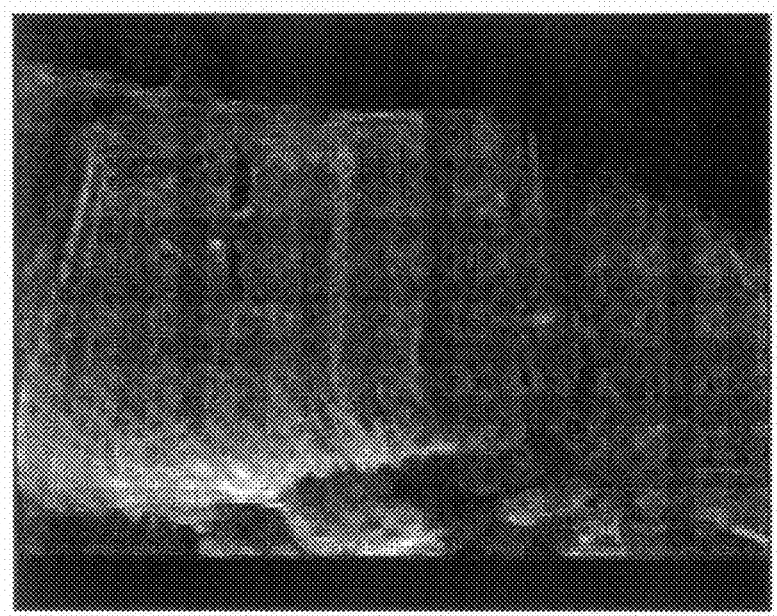
Figures 1, 2, 3, 4, 4B:
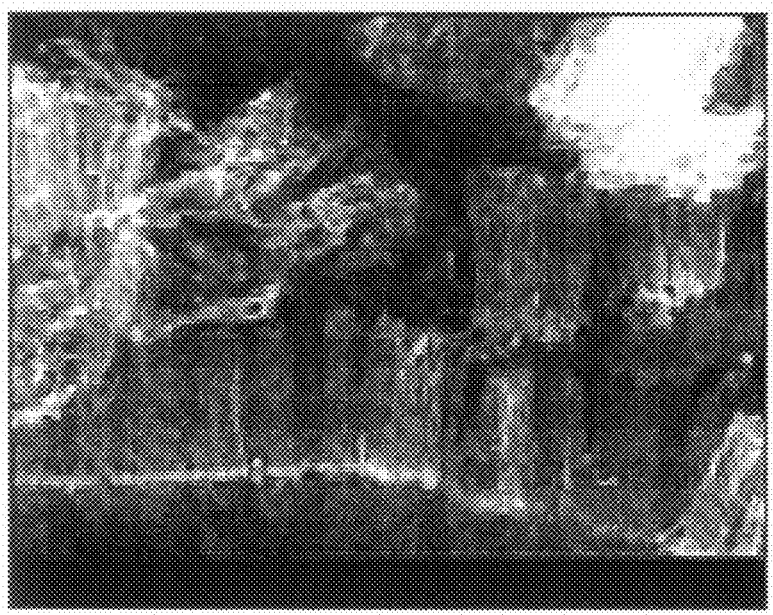
Figures 1, 2, 3, 4, 4C:
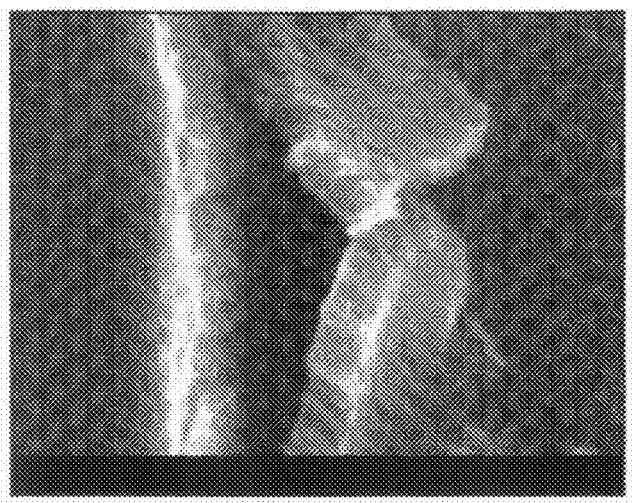
Figures 1, 2, 3, 4, 4D:
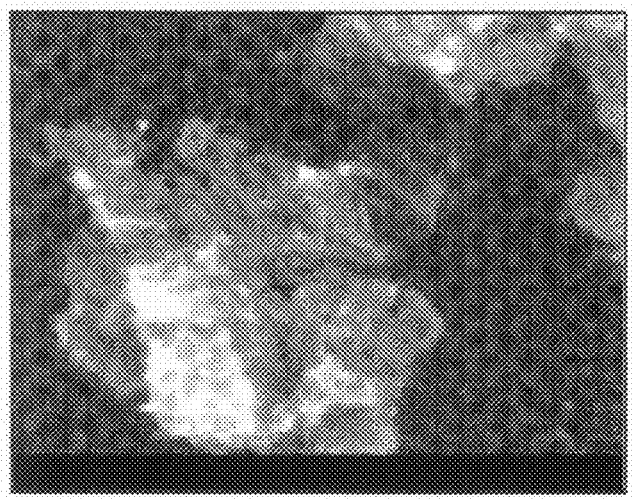
Figures 1, 2, 3, 4, 4E:
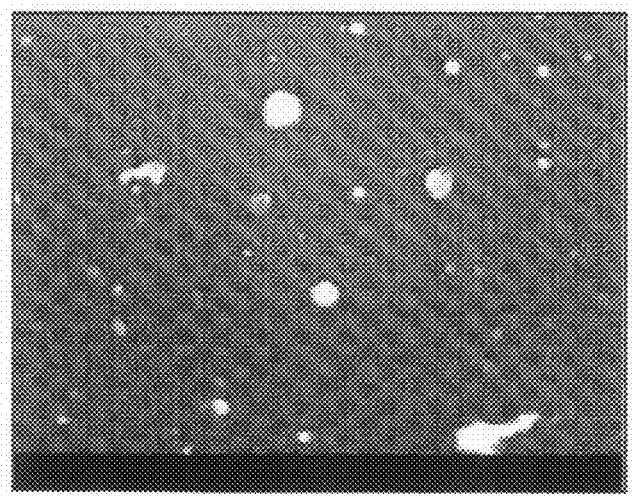
Figures 1, 2, 3, 4, 5, 5A:
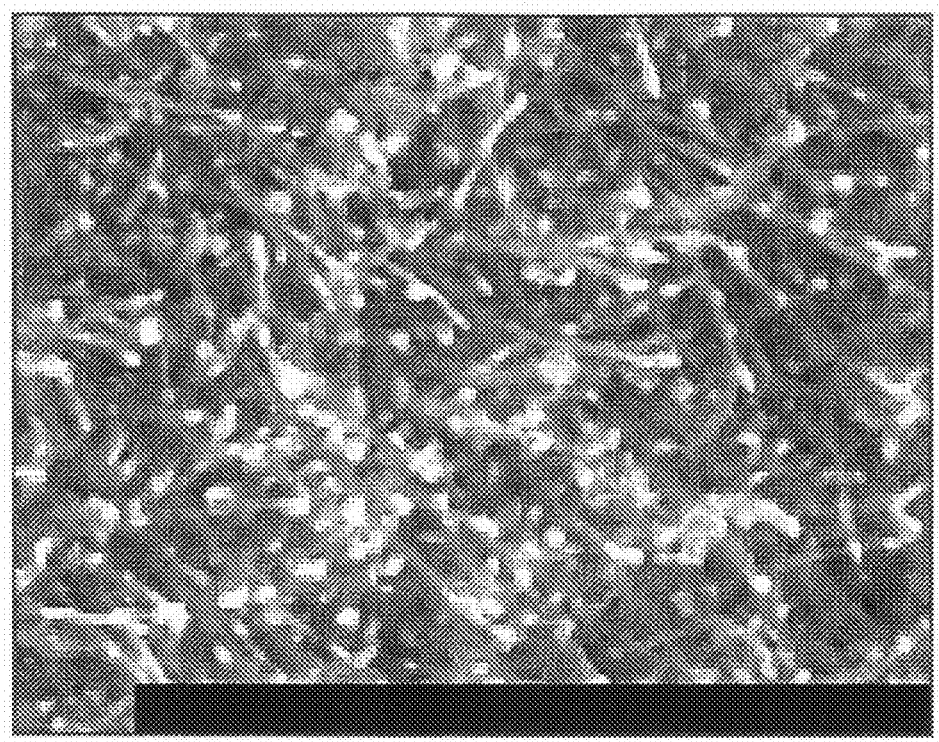
Figures 1, 2, 3, 4, 5, 5B:
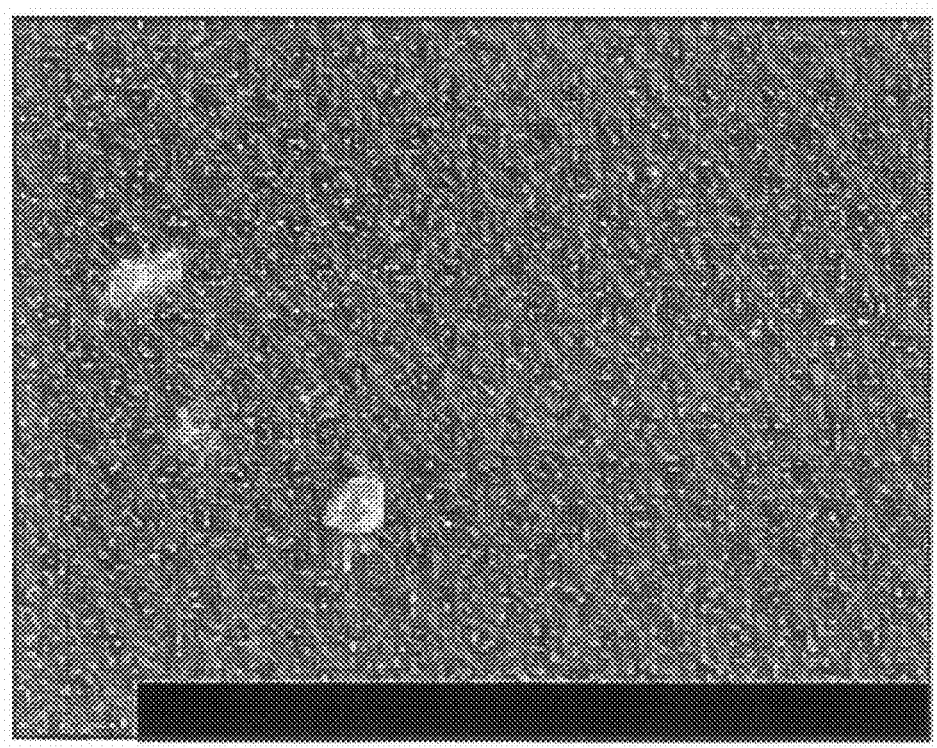
Figures 1, 2:
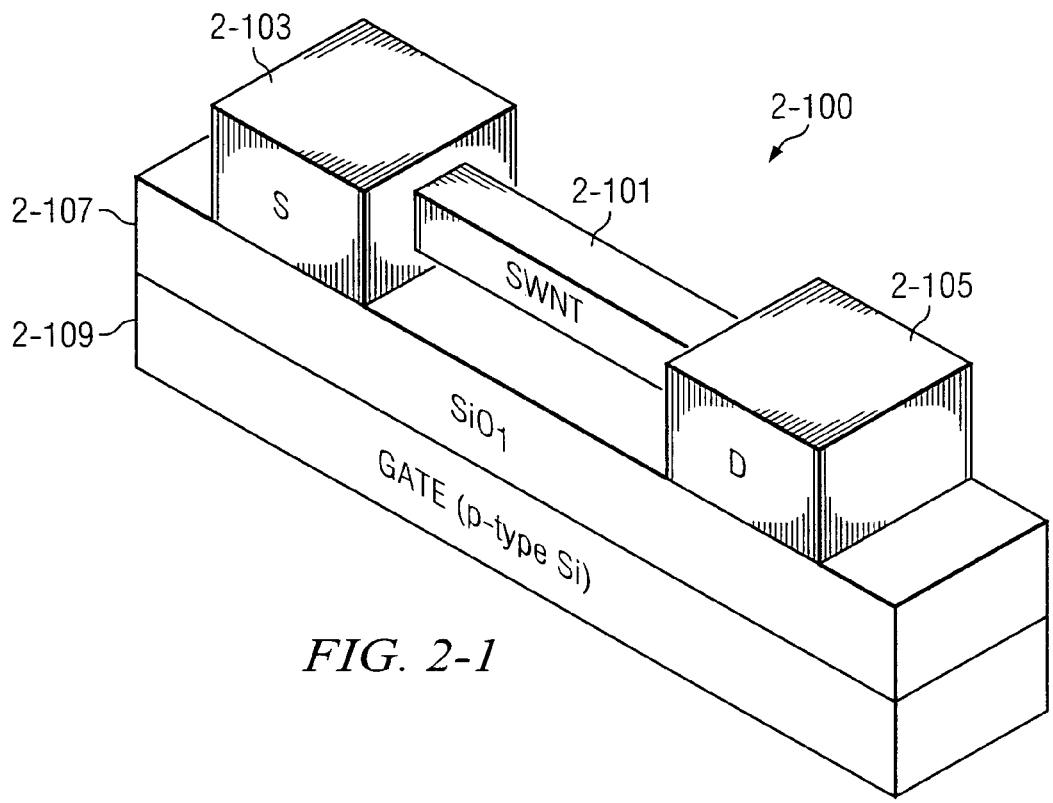
Figure 2:
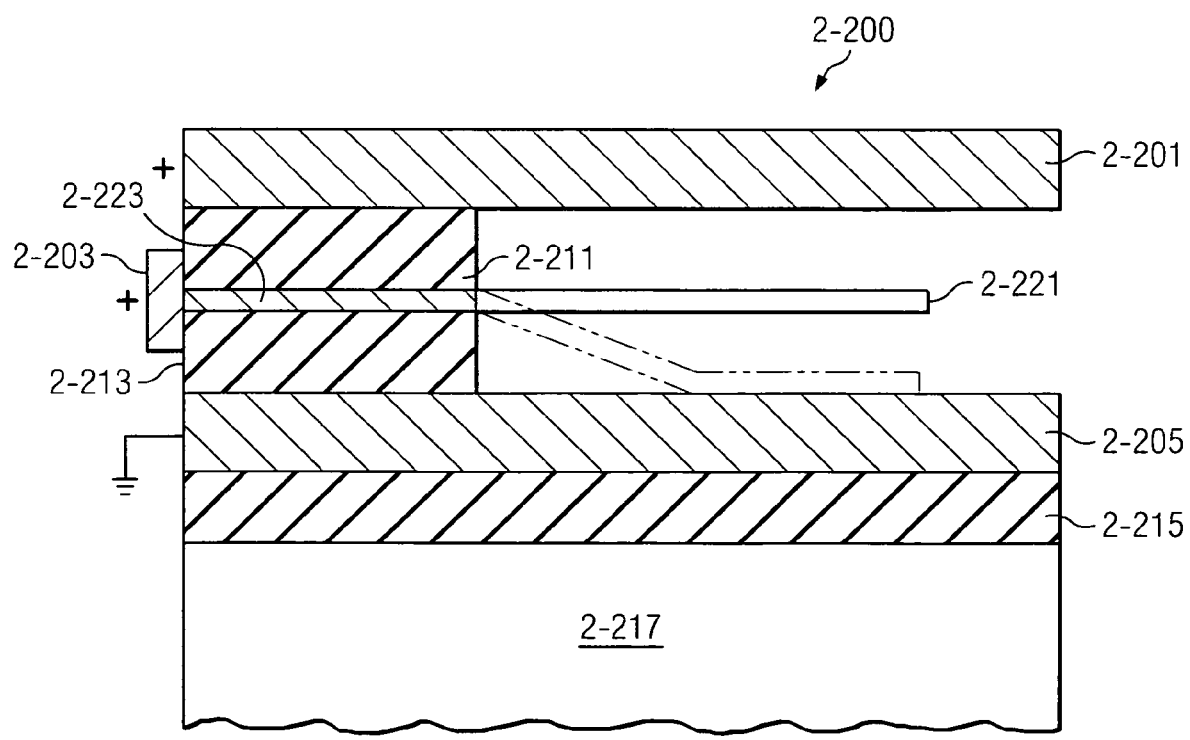

FIG. 3-4 shows a scanning electron microscope photo of multi-walled carbon nanotubes exposed at edges of a patterned CNT-photoresist composite according to one embodiment of the present disclosure. The nanotubes are embedded in the photoresist matrix and suspended from the substrate surface after lithographic patterning. FIG. 3-5 shows a scanning electron microscope photo of multi-walled carbon nanotubes bridging across two titanium electrodes (120 nm in thickness) after a lift-off process. Forming all-around contacts was made possible using the method derived from one embodiment of the present disclosure. Embodiments of the present disclosure may also be applied to other non-silicon planar surfaces such as glass and plastic substrates.

(D) Fabricating Pure Semiconductive SWCNT Material

Due to the fact that metallic CNTs are mixed into semiconductive CNTs, the performance of CNT-field effect transistor (FET) has been less than satisfactory for a long time. Conventional techniques for burning away the metallic CNTs from the CNT mixture often results in contamination of the semiconductive CNTs. One challenge to obtaining high-performance CNT-FET is to obtain very pure semiconductive CNT materials.

Various techniques have also been tried in obtaining pure semiconductive CNT materials. These techniques include controlling the synthesis condition and using post-synthesis processes to obtain purified semiconductive CNTs. The post-synthesis processes include chemical selection, physical trapping, and DNA/RNA and other biomolecule selection. However, the results of these techniques have been less than satisfactory. There is therefore a need for improved techniques to produce pure semiconductor single-walled CNT (SWCNT) materials The present disclosure provides a method for producing pure semiconductor SWCNT. The method includes using a laser in an oxygen gas ambient, controlling a set of laser parameters, and controlling a set of environmental parameters.

The semiconductor CNT does not absorb the laser energy and thus will not experience any temperature increase. On the other hand, the metallic CNT will absorb the laser energy and the temperature will increase as a result of absorbing the laser energy. Accordingly, when the method is applied in an oxygen gas ambient, metallic CNT will burn away first.

In one embodiment, the method also include controlling the laser parameters and controlling the oxygen content in the environment of the ambient temperature, so that metallic CNTs can be burned off and a very pure semiconductive CNT remains in the form of a semiconductor thread.

Metallic CNT has a zero bandgap, so it can absorb light and electromagnetic (EM) wave energy at any wavelength. However, for the semiconductive CNT, the bandgap is not zero. For example, for about 1 nm diameter SWCNT, the bandgap is about 1 ev (0.3 eV~1.6 eV), so only light with photon energy larger than 1 ev can be absorbed by the semiconductive CNT. Thus, the method takes advantage of the difference in optical absorbance between metallic CNT and semiconductive CNT to obtain pure semiconductive CNTs.

According to one embodiment of the present disclosure, metallic CNT is burnt away using a specific laser. When a laser with photon energy of less than 1 ev is used, the semiconductive CNT will not absorb laser energy and therefore, there will be no temperature increase. On the other hand, metallic CNT absorbs the laser energy, and thus the temperature of metallic CNT increases. When the processes are performed in an $O_2$ environment, metallic CNT will burn away first.

Compared to polymer/organic semiconductor materials, CNT semiconductor has such advantages as stability, reliability, high speed, use as p-channel and n-channel, and dense integration, among others. Although some forms of semiconductor bulk, plates, and films currently exist, one embodiment of the present disclosure provides a 'semiconductor thread'. In some ways, fabrication of electronics is analogous to "sewing" according to one embodiment of the present disclosure.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for growth of carbon nanotube (CNT) synthesis at a low temperature, the method comprising:
preparing a catalyst by placing the catalyst between two metal layers on a substrate, the two metal layers comprising chemically active metals having a chemical potential, depositing such placed catalyst on a surface of a wafer, and reactivating the catalyst in a vacuum at the low temperature in a catalyst preparation chamber to prevent a deactivation of the catalyst, wherein the low temperature comprises a temperature less than 500° C.; and growing carbon nanotubes on the substrate in the vacuum in a CNT growth chamber after preparing the catalyst.

2. The method of claim 1, further comprising loading the catalyst placed on the substrate into a loading chamber.

3. The method of claim 1, further comprising lifting off one or more predetermined patterns of the catalyst in a photoresist using one or more photoresist removal liquids or hot vapor in a removal chamber after the catalyst is prepared.

4. The method of claim 3, further comprising transferring the prepared catalyst into a transfer chamber before lifting off the one or more predetermined patterns of the catalyst, wherein one or more of absorbed gasses, residual water, and inorganic solvents on the surface of the wafer is removed.

5. The method of claim 4, wherein the wafer is cooled to the low temperature ranging from around 100° C. to 200° C. for about 3 minutes and the one or more of absorbed gasses, residual water, organic solvents, and inorganic solvents on the surface of the wafer are extracted at a room temperature.

6. The method of claim 4, further comprising transferring the prepared catalyst to the transfer chamber after lifting off the one or more predetermined patterns and before growing the carbon nanotubes, wherein the one or more patterns of the prepared catalyst are degassed.

7. The method of claim 1, wherein depositing the catalyst on the surface of the wafer comprises using one or more of evaporating, sputtering, spin coating and spreading the catalyst on the wafer surface.

8. The method of claim 1, wherein preparing the catalyst comprises preparing the catalyst in an inert gas ambient to prevent a deactivation of the active catalyst.

9. The method of claim 1, wherein preparing catalyst comprises placing the catalyst on a thermal resistance layer placed on top of the substrate after the catalyst is activated.

10. The method of claim 1, wherein growing the nanotubes comprises nucleating the catalyst if none of nanoparticles of the catalyst has been activated during the step of preparing the catalyst.

11. The method of claim 10, wherein nucleating the catalyst comprises annealing the catalyst in a hydrogen plasma at a temperature ranging from around 200° C. to around 300° C. for a period of 5 to 15 minutes.

12. The method of claim 1, wherein growing the carbon nanotubes further comprise growing the carbon nanotubes using a plasma enhanced chemical vapor with methane ($CH_4$) at a temperature between around 200° C. to around 300° C.

13. The method of claim 12, wherein the methane ($CH_4$) is diluted by hydrogen as a carbon source.

14. The method of claim 1, wherein the vacuum is in a high vacuum comprising an order of around $1 \times 10^{-7}$ torr.

15. The method of claim 1, wherein the two metal layers are made of one of titanium (Ti) and nickel (Ni).

16. The method of claim 1, wherein the catalyst is one of an iron (Fe), a cobalt (Co), and a Ni.

17. The method of claim 1, wherein the catalyst has a thickness of about 0.5 mm.

18. The method of claim 1, wherein the two metal layers each have a thickness of about 1 mm.

19. The method of claim 1, wherein the substrate is made of one of silicon, glass, plastic, and ceramic.

20. The method of claim 1, further comprising cooling the wafer to room temperature prior to depositing the active catalyst onto the surface of the wafer.

* * * * *